(12) United States Patent
Moitzi et al.

(10) Patent No.: US 11,658,142 B2
(45) Date of Patent: May 23, 2023

(54) CONNECTION ARRANGEMENT, COMPONENT CARRIER AND METHOD OF FORMING A COMPONENT CARRIER STRUCTURE

(71) Applicant: AT&S Austria Technologie & Systemtechnik Aktiengesellschaft, Leoben (AT)

(72) Inventors: Heinz Moitzi, Zeltweg (AT); Johannes Stahr, St. Lorenzen im Mürztal (AT); Andreas Zluc, Leoben (AT)

(73) Assignee: AT&SAustria Technologie & Systemtechnik AG, Leoben (AT)

( * ) Notice: Subject to any disclaimer, the term of this patent is extended or adjusted under 35 U.S.C. 154(b) by 134 days.

(21) Appl. No.: 16/947,786

(22) Filed: Aug. 17, 2020

(65) Prior Publication Data

US 2021/0074662 A1 Mar. 11, 2021

(30) Foreign Application Priority Data

Sep. 10, 2019 (EP) .................................... 19196363

(51) Int. Cl.
*H01L 21/00* (2006.01)
*H01L 23/00* (2006.01)
(Continued)

(52) U.S. Cl.
CPC .......... *H01L 24/16* (2013.01); *H01L 21/4846* (2013.01); *H01L 23/49838* (2013.01);
(Continued)

(58) Field of Classification Search
CPC ..... H01L 24/16; H01L 21/4846; H01L 24/05; H01L 24/13; H05K 1/111; H05K 1/181; H05K 3/3436
(Continued)

(56) References Cited

U.S. PATENT DOCUMENTS 8,748,751 B2 6/2014 Chuma et al.
2003/0146518 A1* 8/2003 Hikita ................. H01L 25/0657
257/E21.705
(Continued)

FOREIGN PATENT DOCUMENTS

CN 101256972 A 9/2008
CN 106057771 A 10/2016
(Continued)

OTHER PUBLICATIONS

First Office Action in Application CN2020109178448; 1-11; Dec. 1, 2021; China National Intellectual Property Administration; No. 6, Xitucheng Lu, Jimenqiao Haidian District, Beijing City, 1000088, China.
(Continued)

*Primary Examiner* — Andargie M Aychillhum
(74) *Attorney, Agent, or Firm* — Robert A. Blaha; Smith Tempel Blaha LLC

(57) ABSTRACT

A connection arrangement for forming a component carrier structure is disclosed. The connection arrangement includes a first electrically conductive connection element and a second electrically conductive connection element. The first connection element and the second connection element are configured such that, upon connecting the first connection element with the second connection element along a connection direction, a form fit is established between the first
(Continued)

connection element and the second connection element that limits a relative motion between the first connection element and the second connection element in a plane perpendicular to the connection direction. A component carrier and a method of forming a component carrier structure are also disclosed.

15 Claims, 5 Drawing Sheets

(51) Int. Cl.
    *H01L 21/48*      (2006.01)
    *H01L 23/498*      (2006.01)
    *H05K 1/11*      (2006.01)
    *H05K 1/18*      (2006.01)
    *H05K 3/34*      (2006.01)

(52) U.S. Cl.
CPC .............. *H01L 24/05* (2013.01); *H01L 24/13* (2013.01); *H01L 24/81* (2013.01); *H05K 1/111* (2013.01); *H05K 1/181* (2013.01); *H05K 3/3436* (2013.01); *H01L 2224/0401* (2013.01); *H01L 2224/05557* (2013.01); *H01L 2224/05572* (2013.01); *H01L 2224/13019* (2013.01); *H01L 2224/1607* (2013.01); *H01L 2224/16059* (2013.01); *H01L 2224/81143* (2013.01); *H01L 2224/81345* (2013.01); *H01L 2224/81801* (2013.01); *H05K 2201/09472* (2013.01); *H05K 2201/10636* (2013.01); *H05K 2201/10727* (2013.01); *H05K 2203/048* (2013.01)

(58) Field of Classification Search
USPC .......................................................... 361/768
See application file for complete search history.

(56) References Cited

U.S. PATENT DOCUMENTS

| | | |
|---|---|---|
| 2004/0188813 A1 | 9/2004 | Sairam et al. |
| 2004/0197979 A1 | 10/2004 | Jeong et al. |
| 2005/0173795 A1* | 8/2005 | Hodson .................. H01L 24/10 |
| | | 257/E21.511 |
| 2008/0203138 A1 | 8/2008 | Ishikawa et al. |
| 2016/0293565 A1 | 10/2016 | Choi |

FOREIGN PATENT DOCUMENTS

| | | | |
|---|---|---|---|
| CN | 109729639 A | 5/2019 | |
| DE | 102017113094 A1 * | 12/2018 | |
| EP | 3739618 A1 * | 11/2020 | ............. H01L 23/31 |
| JP | 3808030 B2 * | 8/2006 | .......... H01L 23/3114 |
| JP | 2009162738 A * | 7/2009 | ........ G01R 1/06727 |
| JP | 2014179518 A | 9/2014 | |
| KR | 20060105382 A | 10/2006 | |

OTHER PUBLICATIONS

English Translation of cover page First Office Action in Application CN2020109178448; 1-3; Dec. 1, 2021; China National Intellectual Property Administration; No. 6, Xitucheng Lu, Jimenqiao Haidian District, Beijing City, 1000088, China.

Degroote, B.; Communication Pursuant to Article 94(3) EPC in Application No. 19 196 363.6; pp. 1-6; Oct. 7, 2022; European Patent Office; Postbus 5818; 2280 HV Rijswijk, Netherlands.

* cited by examiner

CONNECTION ARRANGEMENT, COMPONENT CARRIER AND METHOD OF FORMING A COMPONENT CARRIER STRUCTURE

CROSS-REFERENCE TO RELATED APPLICATIONS

The present application claims priority to European Patent Application No. 19196363.6, filed Sep. 10, 2019, the entire contents of which is incorporated herein by reference in its entirety.

TECHNICAL FIELD

The invention relates to a connection arrangement, a component carrier and a method of forming a component carrier structure.

TECHNOLOGICAL BACKGROUND

A conventional component carrier comprises a stack having at least one electrically conductive layer structure and at least one electrically insulating layer structure, and component and a connection arrangement to connect the component to the stack. For example, the connection arrangement is formed by pads of the component and vias of the stack, wherein the pads are electrically connected to the vias, for example by soldering.

SUMMARY

There may be a need to provide a connection arrangement, a component carrier and a method of forming a component carrier structure, by which a centering between two connection partners, which are to be connected by the connection arrangement, is enhanced and higher package densities can be achieved.

According to an exemplary embodiment of the invention, a connection arrangement comprises a first electrically conductive connection element and a second electrically conductive connection element. The first connection element and the second connection element are configured such that, upon connecting the first connection element with the second connection element along a connection direction, a form fit is (directly or indirectly) established between the first connection element and the second connection element that limits (or even inhibits) a relative motion between the first connection element and the second connection element in a plane perpendicular to the connection direction.

According to another exemplary embodiment of the invention, a component carrier comprises a stack comprising at least one electrically conductive layer structure and/or at least one electrically insulating layer structure, and the connection arrangement in and/or on the stack.

According to another exemplary embodiment of the invention, a method of forming a component carrier structure comprises connecting a first electrically conductive connection element with a second electrically conductive connection element along a connection direction in such a way that (a direct or indirect) form fit is established between the first connection element and the second connection element that limits (or even inhibits) motion of the first connection element and the second connection element relative to each other in a plane perpendicular to the connection direction.

OVERVIEW OF EMBODIMENTS

The form fit is usually achieved before soldering and enables a more accurate centering of both connection partners before soldering.

In the following, further exemplary embodiments of the present invention will be explained.

In an embodiment, the connection arrangement further comprises a third connection element arranged in the connection direction between the first connection element and the second connection element for accomplishing a form fit both between the first and third connection elements and between the second and third connection elements. The third connection element can be a copper ball which is coated by a coating material.

In an embodiment, a cross-section of at least one of the first connection element and the second connection element has a non-circular cross-section, for example oval, elliptic, rectangular, triangular, star-shaped, blossom-shaped, shamrock-shaped, a alveolar-shaped, honeycomb-shaped, etc. The non-circular cross-section of the first and/or second connection elements, which can be an elevated land or a pillar, allow more accurate connections and high packing densities. Due to the non-circular cross-sections, the registration tolerances can be enlarged. The accuracy in a contacting process can be increased.

Furthermore, due to the non-circular cross section of the connection element, the mechanical strength, in particular the buckling strength and the section modulus can be improved. Due to a larger circumference of the connection element, skin effects (i.e. an increased resistance of current-carrying conductors at high frequencies) can be reduced.

In an embodiment, cooperating surfaces of the connection elements are configured for promoting centering of the connection elements upon their connection, wherein in particular a cooperating surface of one of the first and the second connection elements has a concave shape and a cooperating surface of the other one of the first and the second connection elements has a complementary convex shape in a cross section perpendicular to the connection direction. The convex and concave shapes of the cooperating surfaces of the first and second connection elements can thus be used as a support for centering a connection partner such as a component with respect to another connection partner such as a stack during soldering.

In an embodiment, the connection arrangement comprises solderable material.

In an embodiment, at least one of the connection elements has a concave connection surface with a dimple which is preferably at least partially filled by a solderable material. As the solderable material, soft solders and alloys of copper, silver, zinc, tin, or lead with optional additives of bismuth, indium, cadmium can be used. Also brazing alloys for example of brass or nickel silver are conceivable. The solderable material can be deposited by any method such as sputtering. The use of the dimple enables the use of a larger amount of solderable material compared with a connection surface without dimple. The larger amount of solderable material in turn enables larger distances to be bridged between the first and second connection partners in the connection direction. The dimple can also be used to support cohesion forces to center a connection partner such as a component with respect to another connection partner such as a stack. This especially applies for a relative light component. When a relative heavy component is used, the same can be centered under vibration support such as sound-supported soldering. The centering can take place when the solderable material becomes liquid. As a result, a soldering can be obtained without blowholes, and a surface in a connection region can be sealed without cracks, pores etc.

In an embodiment, the first connection element and the second connection element establish an electric contact and a mechanical contact both in the connection direction and in a direction perpendicular to the connection direction, i.e. one of the first connection element and the second connection element can be guided by the other one of the first connection element and the second connection element along the connection direction during connecting the first connection element with the second connection element before soldering. The first connection element can be composed of multiple spaced bodies delimiting an accommodation volume for receiving and accommodating the second connection element. Thereby, a key-lock function can be achieved. It is advantageous if conical pillars are used so that a good centering property is achieved.

In an embodiment, at least one of the connection elements is a pillar, in particular a copper pillar, a via, a land, a solder ball or a ball comprising a central non-solderable body coated with solderable material. As the solderable material, soft solders and alloys of copper, silver, zinc, tin, or lead with optional additives of bismuth, indium, cadmium can be used. Also brazing alloys for example of brass or nickel silver are conceivable. The solderable material can be deposited by any method such as sputtering. On the one hand, such coated connection elements enable a very reliable connection because a relatively large surface is soldered. On the other hand, a use of smaller solder layers can result in a reduction of a short-circuit bond between connection points.

The pillar can be a conical pillar. The connection joints can include two or more pillars. Ideally, three pillars are preferred in view of the mechanical reliability. A copper pillar can be built-up on a copper plate, on a copper pad or on a copper foil. The copper pillar can be connected to the copper plate or pad by pressing and spot welding. The copper pillar can otherwise be connected by compression bonding or ultrasonic bonding. The copper pillar can have a tolerance of 6 μm or less. The copper pillar can also be deposited on the copper foil, pad or plate by a galvanic process.

In an embodiment, one of the first and second connection elements forms a part, for example a terminal, a pad or a contact, of a component to be embedded or surface mounted in or on a stack of layer structures, and the other one of the first and second connection elements is formed in an interior of the stack or preferably at a main surface of the stack. The other one of the first and second connection elements can protrude in the connection direction from the main surface of the stack of a component carrier structure.

In all embodiments of the present invention, the connection elements (for example the pillars) can have an aspect ratio between the length and a largest or main diameter of more than 1, preferably of more than 2, more preferred more than 3.

In an embodiment of the component carrier structure, the same comprises at least one of a panel, an array, a component carrier, and an arrangement of a component carrier and the component.

In an embodiment of the method, the first and second connection elements are connected by sound-supported soldering. As the solderable material, soft solders and alloys of copper, silver, zinc, tin, or lead with optional additives of bismuth, indium, cadmium can be used. Also brazing alloys for example of brass or nickel silver are conceivable. The solderable material can be deposited by any method such as sputtering.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or prefabricated copper cladded core materials or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imagable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, titanium and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit and a hermetic package. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
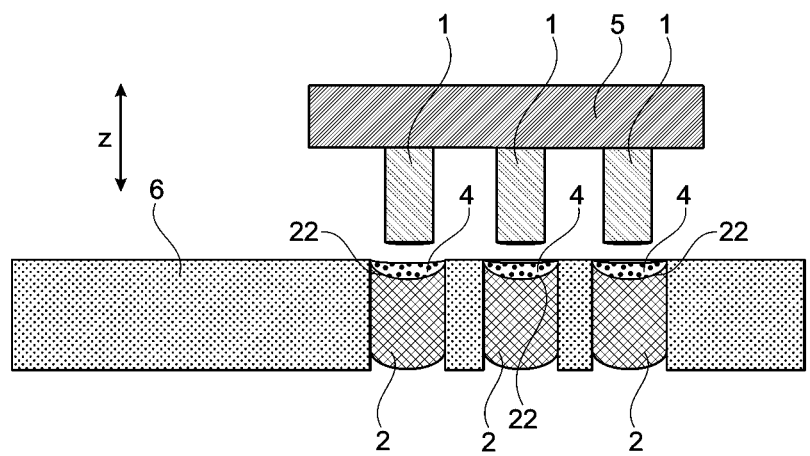
FIG. 1 illustrates a longitudinal section of a connection arrangement according to an exemplary embodiment of the invention.

The illustrations in the drawings are schematically presented. In different drawings, similar or identical elements are provided with the same reference signs.

FIG. 1 illustrates a longitudinal section of a connection arrangement according to an exemplary embodiment of the invention. The connection arrangement is basically used to connect two connection partners, for example a component and a stack, or two PCBs. The pair of both connection partners can comprise the connection arrangement.

The connection arrangement can be part of component carrier structure which comprises at least one of a panel, an array, a component carrier, and an arrangement of a component carrier and a component 5.

The component carrier can comprise at least one component 5 being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a hermetic device, a microelectromechanical system, a microprocessor, a capacitor, a resistor, an inductance, an accumulator, a switch, a camera, an antenna, a magnetic element, a further component carrier, and a logic chip.

The component carrier can comprise a stack 6 comprising at least one electrically conductive layer structure and/or at least one electrically insulating layer structure, and the connection arrangement.

At least one of the electrically conductive layer structures of the component carrier can comprise at least one of the group consisting of copper, aluminum, nickel, silver, gold, palladium, titanium, and tungsten, any of the mentioned materials being optionally coated with supra-conductive material such as graphene.

The electrically insulating layer structure can comprise at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

The component carrier can be shaped as a plate. The component carrier can be configured as one of the group consisting of a printed circuit board, a substrate, and an interposer. The component carrier can be configured as a laminate-type component carrier.

The connection arrangement comprises (in this embodiment three) first electrically conductive connection elements 1 and (in this embodiment three) second electrically conductive connection elements 2. The first connection elements 1 and the second connection elements 2 are configured such that, upon connecting the first connection elements 1 with the second connection elements 2 along a connection direction z, a form fit is directly established between a pair of one of the first connection elements 1 and the corresponding second connection element 2 that limits or even inhibits a relative motion between the first connection element 1 and the second connection element 2 of the pair in a plane perpendicular to the connection direction z.

At least the second connection elements 2 can be formed of copper by a conventional electroplating process.

In this embodiment, the second connection elements 2 each have a concave connection surface 22 with a dimple which is at least partially filled by a solderable material 4. As the solderable material 4, soft solders and alloys of copper, silver, zinc, tin, or lead with optional additives of bismuth, indium, cadmium can be used. Also brazing alloys for example of brass or nickel silver are conceivable. The solderable material 4 can be deposited by any method such as sputtering. By producing the concave connection surface 22 of the second connection elements 2 with the dimple, the same can be used for centering and contacting a matching first connection element 1 which are copper pillars in this embodiment. The use of the dimples further enables the use of a larger amount of solderable material 4 compared with connection surfaces without dimples. The larger amount of solderable material 4 in turn enables larger distances to be bridged between the first and second connection elements 1, 2 in the connection direction z. Ideally, the pillar formed by the first connection element 1 should have a complementary convex shape to enhance the centering process. The convex and concave shapes of the connection surfaces 21, 22 of the first and second connection elements 1, 2 can thus be used as a support for centering the component 5 with respect to the stack 6 before or during soldering. The dimple can be used to assist cohesion forces to center the component 5; this especially applies for a relative light component 5. When a relative heavy component 5 is used, the same can be centered under vibration support such as sound-supported soldering. The centering can take place when the solderable material 4 becomes liquid. As a result, a soldering is achieved without blowholes, and a surface in a connection region can be sealed without cracks, pores etc.

The first connection elements 1 each form a part, for example a terminal, a pad or a contact, of the component 5 to be embedded or surface mounted in or on the stack 6 of layer structures, and the second connection elements 2 are formed in an interior of the stack 6.

Alternatively, instead of being formed in the interior of the stack 6, the second connection elements 2 can protrude in the connection direction z from the main surface of the stack 6 of the component carrier structure, or they can be formed at or on a main surface of the stack 6. In the context of the present invention, the term "main surface" designates that surface where terminals or contacts are arranged or that surface which extends perpendicular to a direction in which the conductive and insulating layers are superposed (layered) on each other.

Figure 2:
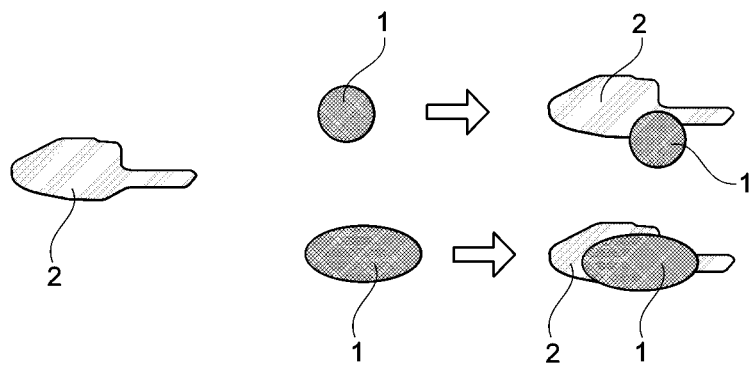
FIG. 2 illustrates different cross-sectional views of first and second connection elements according to exemplary embodiments of the invention.

FIG. 2 illustrates different cross-sectional views of first and second connection elements 1, 2 according to exemplary embodiments of the invention.

At the left side of FIG. 2, a cross section of the second connection element 2 is shown, which has a non-circular cross-section.

In the upper middle of FIG. 2, the first connection element 1 has a circular cross-section, whereas in the lower middle of FIG. 2, the first connection element 1 has a non-circular cross-section. As can be taken from the right side of FIG. 2, a contact surface between the first and second connection elements 1, 2 is enlarged with the first connection element 1 having the non-circular cross-section.

The non-circular cross-sections can have an oval, elliptic or any other non-circular shape. Due to the non-circular cross-sections, the registration tolerances can be enlarged. The accuracy in a contacting process can also be increased.

Figure 3:
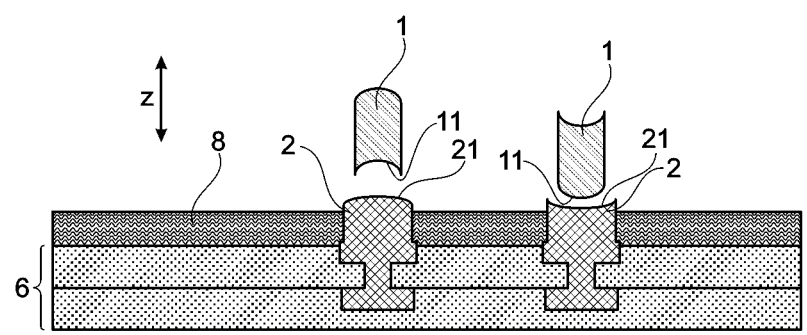
FIG. 3 illustrates a longitudinal section of a connection arrangement according to an exemplary embodiment of the invention.

FIG. 3 illustrates a longitudinal section of a connection arrangement according to an exemplary embodiment of the invention. Each first connection element 1 has a first cooperating surface 11, and each second connection element 2 has a second cooperating surface 12. During connecting the first and second connection elements 1, 2, the first and second cooperating surfaces 11, 21 cooperate and engage with each other. The cooperating surfaces 11, 21 of the connection elements 1, 2 are configured for promoting centering of the connection elements 1, 2 upon their connection.

The first and second cooperating surfaces 11, 21 have complementary shapes. In more detail, the cooperating surface 11, 21 of one of the first and the second connection elements 1, 2 has a concave shape and the cooperating surface 11, 21 of the other one of the first and the second connection elements 1, 2 has a complementary convex shape in the cross section perpendicular to the connection direction z.

The second connection elements 2 can be formed of copper by a conventional electroplating process. Each second connection element 2 has a shape of a pillar or of an elevated land which protrudes from a solder mask 8, which is provided as an uppermost layer on the stack 6. At the top of each pillar or elevated land, the cooperating surfaces 11, 21 are provided.

For example, by the complementary (convex or concave) shapes of the cooperating surfaces 21, 22 of the first and second connection elements 1, 2, where one of them can optionally have the shape of an elevated land, the centering of the first and second connection elements 1, 2 and thus between the connection partners is improved.

Figure 4:
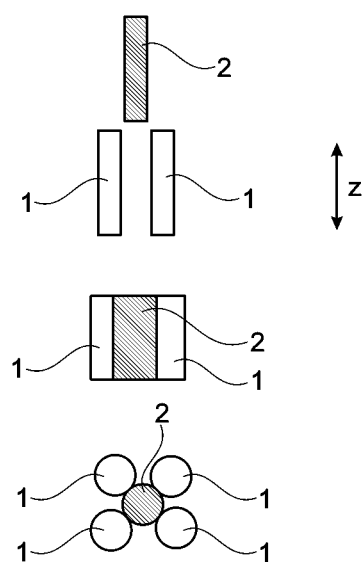
FIG. 4 illustrates a longitudinal section and a cross section of a connection arrangement according to an exemplary embodiment of the invention.

FIG. 4 illustrates a longitudinal section and a cross section of a connection arrangement according to an exemplary embodiment of the invention. The top longitudinal view depicts the connection arrangement before soldering, and the lower longitudinal view depicts the connection arrangement after soldering.

A plurality of first connection elements 1 and one second connection element 2 establish an electric contact and a mechanical contact both in the connection direction z and in a direction perpendicular to the connection direction z. In more detail, the second connection element 2 is guided by the first connection elements 1 along the connection direction z during connecting the first connection elements 1 with the second connection element 2.

The first connection element 1 is composed of multiple spaced bodies 1 delimiting an accommodation volume for receiving and accommodating the second connection element 2.

The embodiment of FIG. 4 uses a key-lock function, and the first and second connection elements 1, 2 can have a shape of conical cylinders or pillars. The pillars can be placed in such a way that the key-lock function is enabled. It is advantageous if the pillar(s) of at least one of the first and second connection elements 1, 2 has (have) a conical design so that a good centering property is achieved.

It is to be noted that a connection by means of the key-lock function can also achieved by other connection elements except for the pillars.

Figure 5:
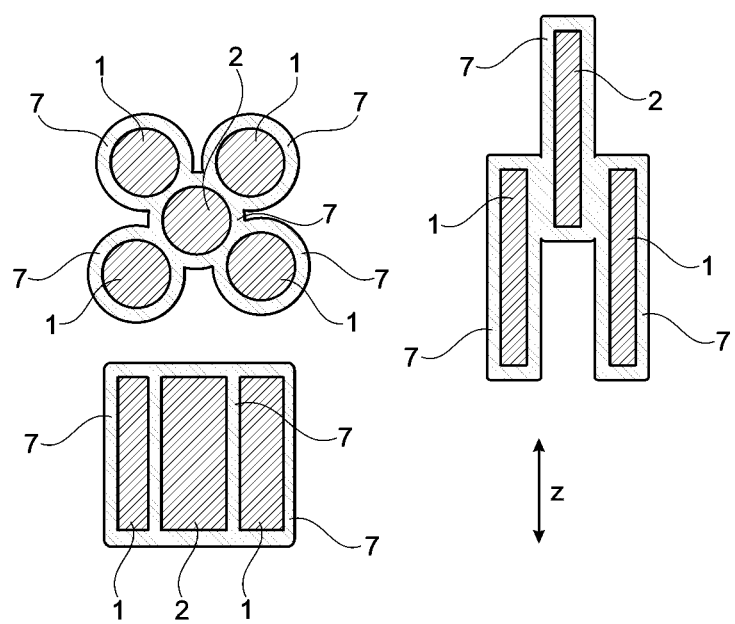
FIG. 5 illustrates cross-sectional views and longitudinal sections of a connection arrangement according to an exemplary embodiment of the invention.

FIG. 5 illustrates a cross-sectional view and longitudinal sections of a connection arrangement according to an exemplary embodiment of the invention. The longitudinal view at the top right position depicts the connection arrangement before soldering, and the longitudinal view at the lower left position depicts the connection arrangement after soldering.

The embodiment of FIG. 5 is similar to the embodiment of FIG. 4, except for the first and second connection elements 1, 2 which are coated with solderable material 7. As the solderable material 7, soft solders and alloys of copper, silver, zinc, tin, or lead with optional additives of bismuth, indium, cadmium can be used. Also brazing alloys for example of brass or nickel silver are conceivable. The solderable material 7 can be deposited by any method such as sputtering, electroless tin plating or electrolytic deposition of a tin/sliver alloy. On the one hand, such coated copper pillars enable a very reliable key lock connection because a relatively large surface is soldered. On the other hand, a use of smaller solder layers can result in a reduction of a short-circuit bond between connection points. It is to be noted that a connection by means of the key-lock function can also achieved by other coated connection elements except for the pillars.

Figure 6:
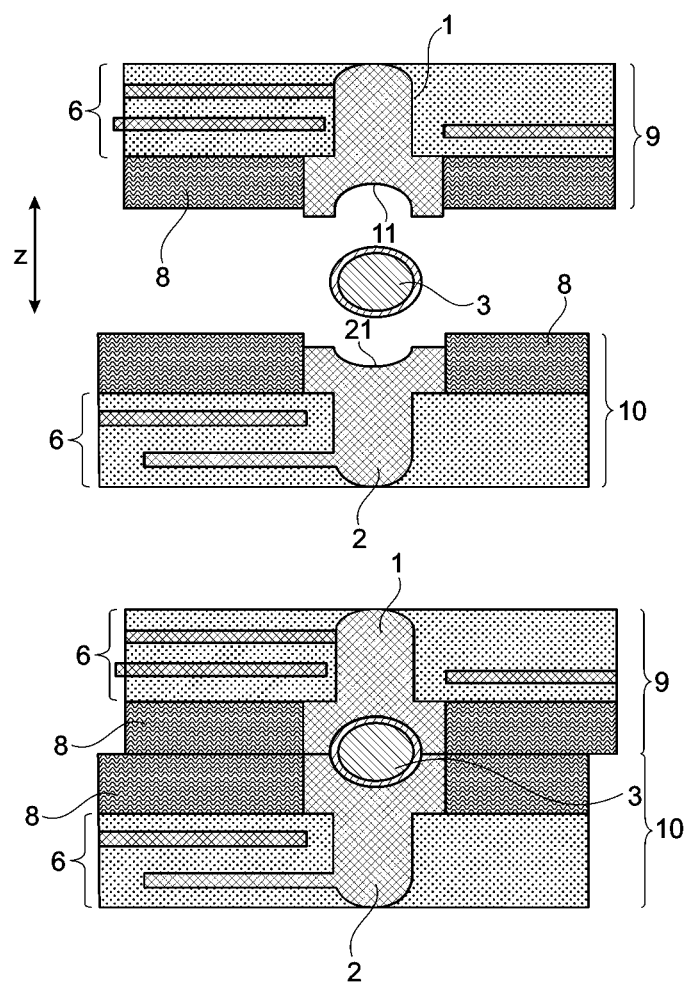
FIG. 6 illustrates longitudinal sections of a connection arrangement according to an exemplary embodiment of the invention.

FIG. 6 illustrates longitudinal sections of a connection arrangement according to an exemplary embodiment of the invention. In this embodiment, the connection arrangement is provided to connect two component carriers 9, 10 to each other, which are for example two printed circuit boards (PCB). Each component carrier 9, 10 comprises a stack 6 having at least one electrically conductive layer structure and/or at least one electrically insulating layer structure, a solder mask 8 at an outermost connection surface of each stack 6, and the connection arrangement in and/or on each stack 6.

The connection arrangement comprises first and second connection elements 1, 2 which are formed as vias in the respective electrically conductive layer structure of the stacks 6. The connection arrangement further comprises a third connection element 3 arranged in the connection direction z between the first connection element 1 and the second connection element 2 for accomplishing a form fit both between the first and third connection elements 1, 3 and between the second and third connection elements 2, 3. In the embodiment of FIG. 6, a form fit is thus indirectly formed between the first and second connection elements 1, 2, whereas, in contrast thereto, the form fit in the embodiments of FIGS. 1 and 3 is rather directly formed between the first and second connection elements 1, 2.

The third connection element 3 is made of or comprises a soldering material and has a convex shape. If the third connection element 3 is a solder ball with a copper core, a defined distance between the component carriers 9, 10 can be set.

The first and second connection elements 1, 2 each have a land with a cooperating surface 11, 21 which is configured for promoting centering of the connection elements 1, 2, 3 upon their connection. The cooperating surfaces 11, 21 of the first and second connection elements 1, 2 each have a concave shape in a section perpendicular to the connection direction, which corresponds to the complementary convex shape of the third connection element 3. Thus, there are dimples in the cooperating surfaces 11, 21, which allow the use of a larger volume of soldering material. At the same time, larger distances in the connection direction z can be bridged between the connection partners.

The first and second connection elements 1, 2 formed as vias can be used as a centering aid when connecting both component carriers 9, 10. The solder masks 8 can be used to create a centering aid for the lands having the concave cooperating surfaces 11, 21.

Figure 7:
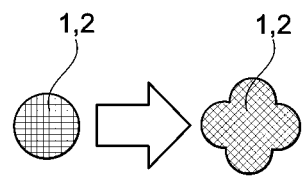
FIG. 7 illustrates cross-sectional views of connection elements according to exemplary embodiments of the invention.

FIG. 7 illustrates cross-sectional views of connection elements according to exemplary embodiments of the invention. At the left side of FIG. 7, the connection element 1, 2 has a circular cross-section, whereas the connection element 1, 2 at the right side of FIG. 7 has a non-circular cross-section. In more detail, the cross section of the connection element 1, 2 at the right side of FIG. 7 is composed by regularly arranging (in this embodiment four) circular cross sections around a central circular cross section. Thus, the cross section of the connection element 1, 2 at the right side of FIG. 7 is blossom-shaped or shamrock-shaped.

Figure 8:
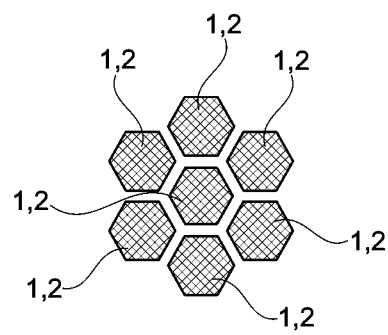
FIG. 8 illustrates a cross-sectional view of connection elements according to an exemplary embodiment of the invention.

FIG. 8 illustrates a cross-sectional view of connection elements according to an exemplary embodiment of the invention. Each connection element 1, 2 has an alveolar-shaped, honeycomb-shaped or hexagonal cross section. Furthermore, a plurality of connection elements 1, 2 are arranged adjacent to each other. Due to the hexagonal or honeycomb-shaped cross sections, the highest packing density of the connection elements 1, 2 can be achieved. The edges of the alveolar-shaped, honeycomb-shaped or hexagonal cross section can be rounded.

Figure 9:
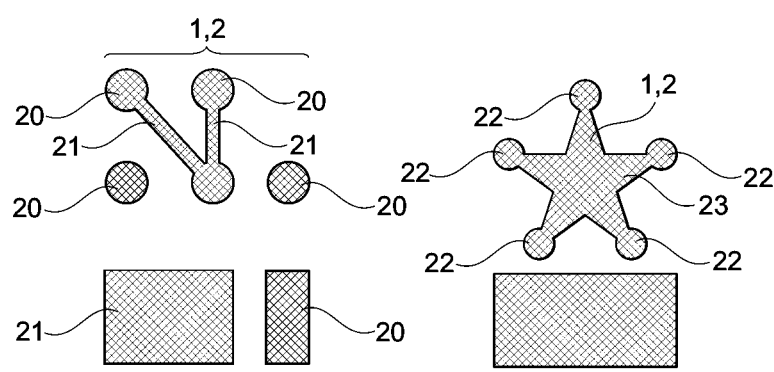
FIG. 9 illustrates cross-sectional views and longitudinal sections of connection elements according to exemplary embodiments of the invention.

FIG. 9 illustrates cross-sectional views and longitudinal sections of connection elements according to exemplary embodiments of the invention.

At the left upper side of FIG. 9, a cross section of a connection element 1, 2 is shown, and at the left lower side of FIG. 9, a front view of the connection element 1, 2 is shown. The connection element 1, 2 at the left side of FIG. 9 is composed of a plurality of circular or non-circular pillars 20. Some of the pillars are interconnected by elongated lands 21.

At the right upper side of FIG. 9, a cross section of a connection element 1, 2 is shown, and at the right lower side of FIG. 9, a front view of the connection element 1, 2 is shown. The connection element 1, 2 at the right side of FIG. 9 is composed of a star-shaped basis element 23. At each tip of the star-shaped basis element 23, a circular or non-circular pillar 22 is arranged.

The elongated lands 21 and the star-shaped basis element 23, which interconnect the pillars 20 and 22, respectively, can have a contribution to a reduction in the number of rewiring layers.

Due to the non-circular cross sections of the connection elements 1, 2 in the embodiments of FIGS. 2 and 7-9, the mechanical strength, in particular the buckling strength and the section modulus can be improved even when the surface area is equivalent to a circular cross section. Due to a larger circumference, skin effects (i.e. an increased resistance of current-carrying conductors at high frequencies) can be reduced.

In all embodiments of the present invention, at least one of the connection elements 1, 2, 3 can be a pillar, in particular a copper pillar, a via, a land, a solder ball or a ball comprising a central non-solderable body coated with solderable material 7. The pillar can be a conical pillar. The connection joints can include two or more pillars. Ideally, three pillars are preferred in view of the mechanical reliability.

The copper pillar can be built-up on a copper plate, on a copper pad or on a copper foil. The copper pillar can be connected to the copper plate or pad by pressing and spot welding. The copper pillar can otherwise be connected by compression bonding or ultrasonic bonding. The copper pillar can have a tolerance of 6 μm or less. The copper pillar can also be deposited by a galvanic process on the copper foil, pad or plate.

In all embodiments of the present invention, the connection elements 1, 2 (for example the pillars) can have an aspect ratio between the length and a largest or main diameter of more than 1, preferably of more than 2, more preferred more than 3.

Generally, the first and second connection elements 1, 2 can be connected by sound-supported soldering.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A connection arrangement for forming a component carrier structure, the connection arrangement comprising:
   a first electrically conductive connection element; and
   a second electrically conductive connection element;
   wherein the first connection element and the second connection element are configured such that, upon connecting the first connection element with the second connection element along a connection direction, a form fit is established between the first connection element and the second connection element that limits a relative motion between the first connection element and the second connection element in a plane perpendicular to the connection direction,
   wherein at least one of the connection elements is a pillar having a non-circular cross-section, wherein at least one of the connection elements is composed by a plurality of pillars, wherein some of the pillars are interconnected by elongated pads.

2. The connection arrangement according to claim 1, further comprising:
a third connection element arranged in the connection direction between the first connection element and the second connection element for accomplishing a form fit both between the first and third connection elements and between the second and third connection elements.

3. The connection arrangement according to claim 1, wherein cooperating surfaces of the connection elements are configured for promoting centering of the connection elements upon their connection, wherein a cooperating surface of one of the first and the second connection elements has a concave shape and a cooperating surface of the other one of the first and the second connection elements has a complementary convex shape.

4. The connection arrangement according to claim 1, wherein at least one of the connection elements has a concave connection surface with a dimple which is at least partially filled by a solderable material.

5. The connection arrangement according to claim 1, wherein the first connection element and the second connection element establish an electric contact and a mechanical contact both in the connection direction and in a direction perpendicular to the connection direction.

6. The connection arrangement according to claim 5, wherein the first connection element is composed of multiple spaced bodies delimiting an accommodation volume for receiving and accommodating the second connection element.

7. The connection arrangement according to claim 1, wherein at least one of the connection elements is a copper pillar, a via, a land, a solder ball or a ball comprising a central non-solderable body coated with solderable material.

8. The connection arrangement according to claim 1, wherein one of the first and second connection elements forms a part of a component to be embedded or surface mounted in or on a stack of layer structures, and the other one of the first and second connection elements is formed in an interior of the stack or at a main surface of the stack.

9. The connection arrangement according to claim 8, wherein the other one of the first and second connection elements protrudes in the connection direction from the main surface of the stack of a component carrier structure.

10. The connection arrangement according to claim 9, wherein the component carrier structure comprises at least one of a panel, an array, a component carrier, and an arrangement of a component carrier and the component.

11. A component carrier, comprising:
a stack including at least one electrically conductive layer structure and/or at least one electrically insulating layer structure; and
a connection arrangement in and/or on the stack, the connection arrangement including a first connection element and a second connection element, the connection elements configured such that upon connecting the first connection element with the second connection element along a connection direction, a form fit is established between the first connection element and the second connection element that limits a relative motion between the first connection element and the second connection element in a plane perpendicular to the connection direction,
wherein at least one of the connection elements is a pillar having a non-circular cross-section,
wherein at least one of the connection elements is composed by a plurality of pillars, wherein some of the pillars are interconnected by elongated pads.

12. The component carrier according to claim 11, comprising at least one of the following features:
at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of the group consisting of copper, aluminum, nickel, silver, gold, palladium, and tungsten;
wherein the electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

13. A method of forming a component carrier structure, the method comprising:
providing a first electrically conductive connection element and a second electrically conductive connection element;
connecting the first electrically conductive connection element with the second electrically conductive connection element along a connection direction in such a way that a form fit is established between the first connection element and the second connection element that limits motion of the first connection element and the second connection element relative to each other in a plane perpendicular to the connection direction,
wherein at least one of the connection elements is a pillar having a non-circular cross-section,
wherein at least one of the connection elements is composed by a plurality of pillars, wherein some of the pillars are interconnected by elongated pads.

14. The method according to claim 13,
wherein the first and second connection elements are connected by sound-supported soldering.

15. A connection arrangement for forming a component carrier structure, the connection arrangement comprising:
a first electrically conductive connection element; and
a second electrically conductive connection element;
wherein the first connection element and the second connection element are configured such that, upon connecting the first connection element with the second connection element along a connection direction, a form fit is established between the first connection element and the second connection element that limits a relative motion between the first connection element and the second connection element in a plane perpendicular to the connection direction, wherein the first connection element is composed of multiple spaced bodies delimiting an accommodation volume for receiving and accommodating the second connection element.

\* \* \* \* \*